United States Patent
Duden et al.

[11] Patent Number: 5,901,923
[45] Date of Patent: May 11, 1999

[54] ROLLING GIMBAL HARNESS

[75] Inventors: Quenten E. Duden; Wayne L. Sunne; Rene D. Perez, all of Tucson; Ronald P. Lera, Oro Valley, all of Ariz.

[73] Assignee: Hughes Electronics Corporation, El Segundo, Calif.

[21] Appl. No.: 08/929,136

[22] Filed: Sep. 5, 1997

[51] Int. Cl.$^6$ .............. F41G 7/00; H01B 3/00; H01B 7/00; H01R 9/07
[52] U.S. Cl. .............. 244/3.16; 174/72 A; 174/117 F; 439/497
[58] Field of Search .............. 244/3.16; 174/72 A, 174/117 F; 439/497, 579

[56] References Cited

U.S. PATENT DOCUMENTS

| | | | |
|---|---|---|---|
| 3,836,415 | 9/1974 | Hilderbrandt | 174/72 A |
| 3,898,371 | 8/1975 | Bridgett | 174/72 A |
| 4,012,577 | 3/1977 | Lang et al. | 174/117 F |
| 4,227,041 | 10/1980 | Den et al. | 174/117 F |
| 4,404,424 | 9/1983 | King et al. | 174/117 F |
| 4,520,973 | 6/1985 | Clark et al. | 244/3.16 |
| 4,738,412 | 4/1988 | Ozunas | 244/3.16 |
| 4,995,828 | 2/1991 | Goodman et al. | 439/497 |
| 5,283,390 | 2/1994 | Hubis et al. | 174/117 F |
| 5,306,869 | 4/1994 | Springer et al. | 174/117 F |
| 5,384,431 | 1/1995 | Tusques | 174/117 F |
| 5,389,791 | 2/1995 | Passmore | 244/3.16 |
| 5,483,020 | 1/1996 | Hardie et al. | 174/117 F |

*Primary Examiner*—Charles T. Jordan
*Assistant Examiner*—Theresa M. Wesson
*Attorney, Agent, or Firm*—Michael W. Sales

[57] ABSTRACT

A rolling gimbal harness for interconnecting between a gimbal mounted electronics assembly and a near gimbal electronics assembly in an airborne missile. The harness negotiates the dynamic range of the gimbal while exerting very little spring torque and friction. The harness is a flat ribbon of many shielded twisted wire pairs embedded in a highly flexible insulation material. The twisted wire pairs are terminated in very small connectors with pins having 0.025 spacing. The harness includes a pre-formed arcuate region which follows a circumferential path defined by the periphery of the gimbal platform.

13 Claims, 5 Drawing Sheets

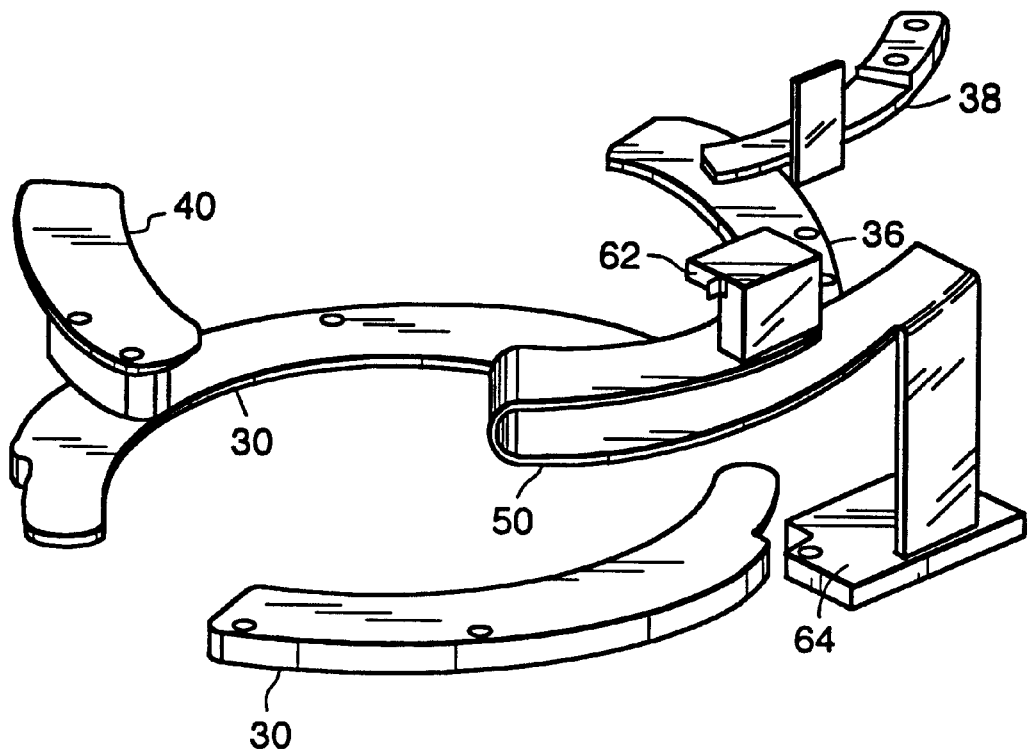
FIG. 3A
FIG. 3B
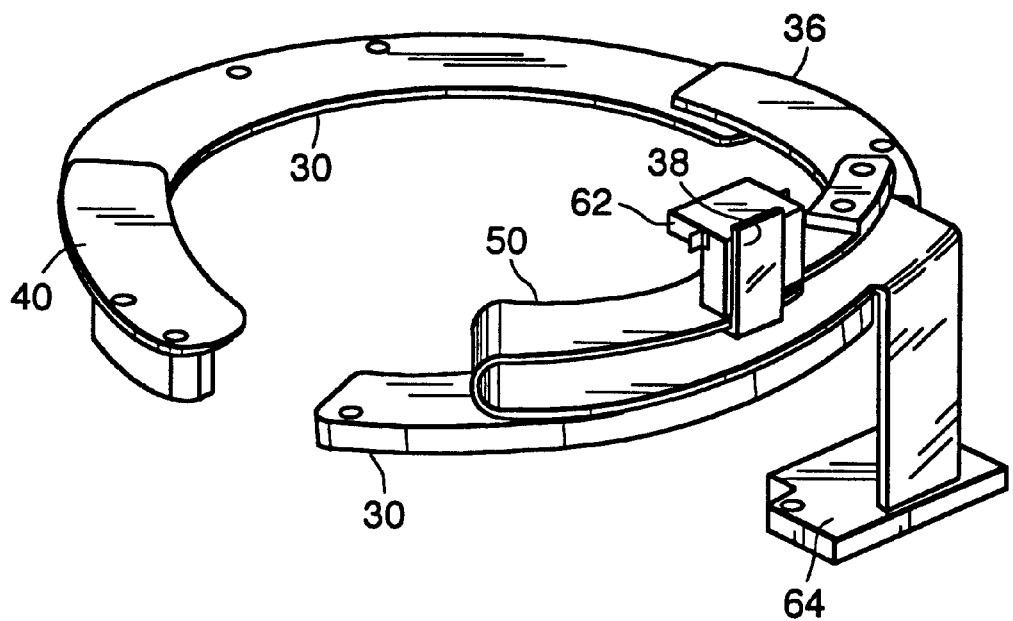

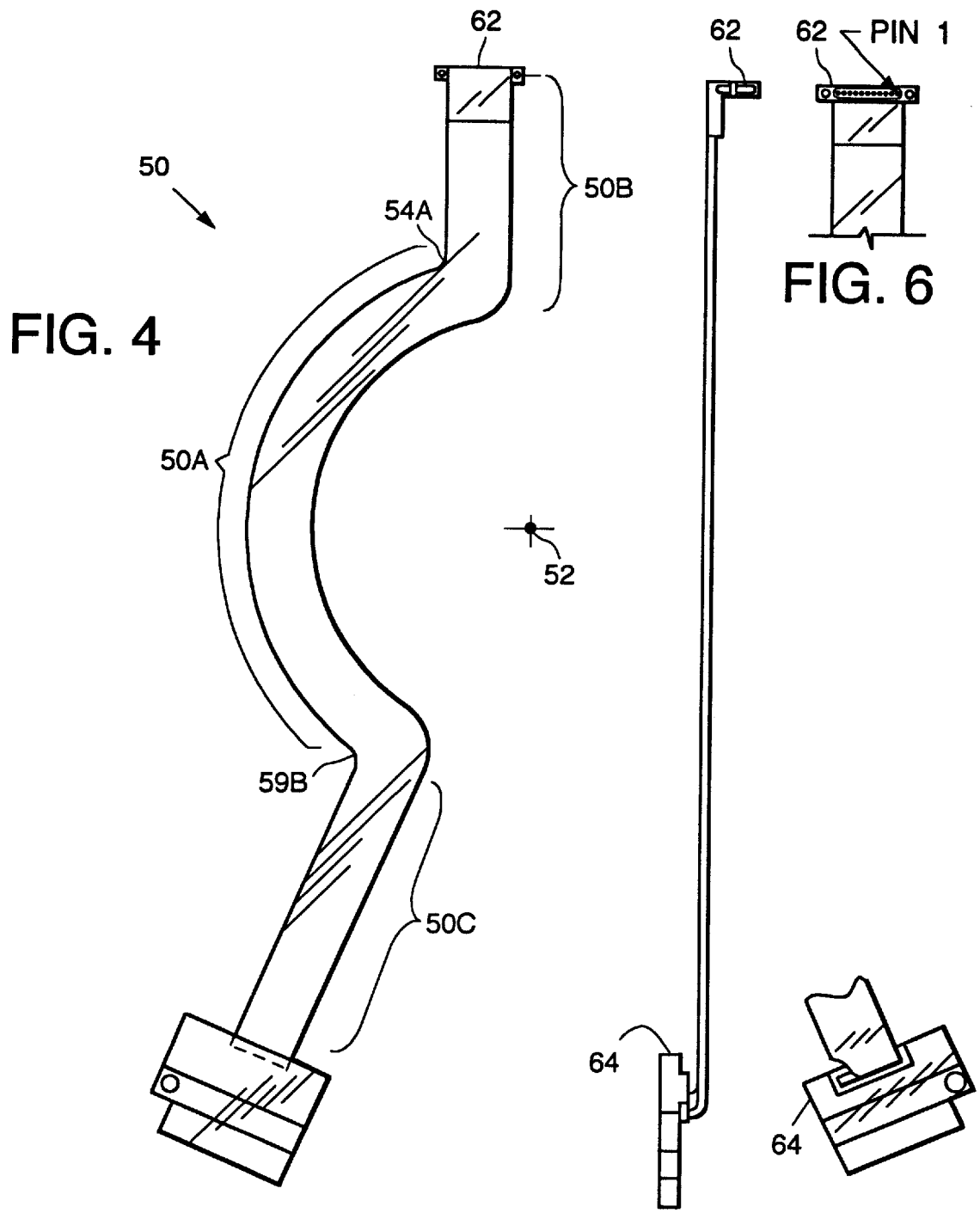

ROLLING GIMBAL HARNESS

TECHNICAL FIELD OF THE INVENTION

This invention relates to techniques for providing electrical connections between circuit assemblies which move in relation to each other, and more particularly to a rolling gimbal harness.

BACKGROUND OF THE INVENTION

In applications such as airborne missiles, for example, there is a need to conduct electrical signals between circuit assemblies which move in relation to each other. For example, missile guidance components can be mounted on a gimbal which has a dynamic range about a Y axis. It is necessary to provide a hard-wired electrical connection between the gimbal-mounted component and a circuit assembly which is mounted off the gimbal and is stationary. The problem is to provide a means of carrying the signals between the gimbal-mounted component and the stationary assembly as the gimbal is rolling and seeking a target, while complying with several requirements. These requirements include minimal space for the connection, a wide gimbal angle, and extremely tight spring torque and friction tolerances. In other words, the signal has to get to the gimbal-mounted component without imposing any physical restraint on the gimbal.

Conventionally, connections between electrical assemblies which move relative to one another are made by flexible harnesses which are relatively stiff. Moreover, these harnesses are made of twisted shielded wire pairs terminated in "Micro" connectors, wherein the pins are 0.050 inches apart, which are relatively large.

It would be an advantage to provide a cross gimbal harness assembly which is highly flexible.

It would further be advantageous to provide a cross gimbal harness assembly which incorporates very small connectors.

SUMMARY OF THE INVENTION

A highly flexible wiring harness is described, and comprises a plurality of shielded twisted wire pairs, each comprising two insulated signal wires twisted together and covered with a flexible, electrically conductive shielding. The twisted wire pairs are embedded in an outer insulator formed of a highly flexible non-conducting material, in an aligned configuration to form a ribbon. The outer insulator has a flat, thin external ribbon configuration to define the outer perimeter of the wiring harness. The outer insulator is in direct contact with the flexible shielding. This enables the wire pairs to be closely aligned and to be terminated in a connector having pins spaced on 0.025 inch centers, in an exemplary embodiment.

The harness includes an arcuate region which is pre-formed to follow a curved path, such as a circumferential path.

In an exemplary embodiment, the harness connects between an on gimbal electronics assembly, and a stationary electronics assembly, and is able to negotiate the dynamic range of the gimbal with very little spring torque and friction.

BRIEF DESCRIPTION OF THE DRAWING

These and other features and advantages of the present invention will become more apparent from the following detailed description of an exemplary embodiment thereof, as illustrated in the accompanying drawings, in which:

FIG. 3A is an isometric, exploded view of the rolling gimbal harness and the gimbal track. FIG. 3B is an assembled version of this isometric view.

FIG. 4 is a top view of the rolling gimbal harness in a flattened state, showing the pre-forming of the harness.

FIG. 5 is a front view of the harness of FIG. 4.

FIG. 6 is a partial bottom view of the harness of FIG. 4, showing one terminating connector.

FIG. 7 is a partial bottom view of the harness of FIG. 4, showing a second terminating connector.

DETAILED DESCRIPTION OF THE PREFERRED EMBODIMENT

Figure 1:
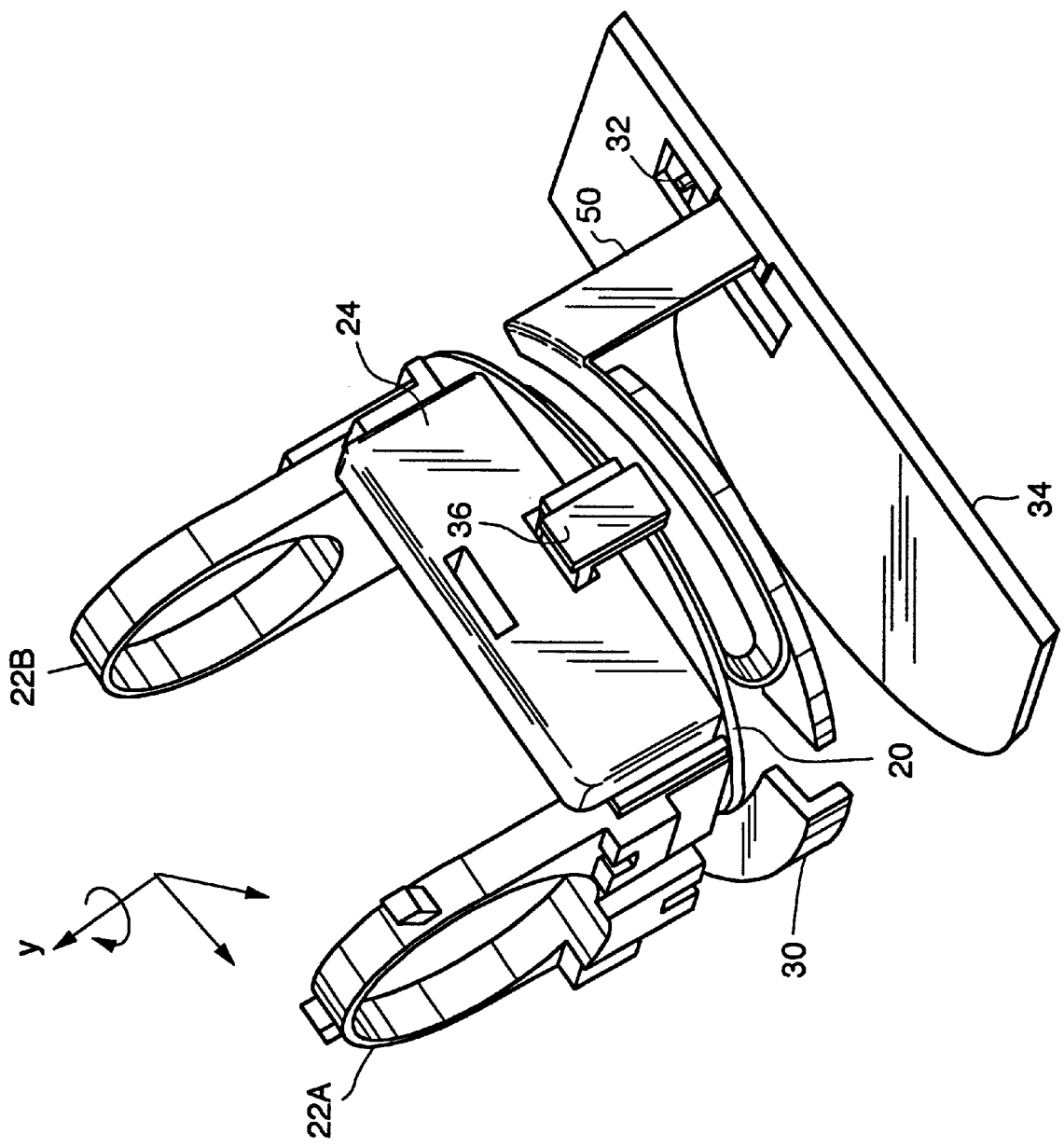
FIG. 1 is an isometric view illustrating gimbal mounted circuit elements and a stationary circuit assembly interconnected by a rolling gimbal harness in accordance with the invention.

A rolling gimbal harness is disclosed which negotiates the dynamic range of the gimbal with very little spring torque and friction. An exemplary application is in a guided airborne missile. FIG. 1 illustrates a gimbal platform 20 which carries the gimbal yoke structure 22 and the on-gimbal electronics (OGE) assembly 24. The yoke structure has a dynamic range and rolls about the Y axis as a gimbal harness track 30 remains stationary. A near-gimbal electronics (NGE) assembly 32 is mounted on a circuit board 34; the circuit board 34 and assembly 32 remain stationary while the gimbal yoke structure rolls about the Y axis. The NGE and the OGE are circuit cards that support the software to pre-process information to the rest of the guided missile.

In accordance with the invention the NGE assembly 32 is connected to the OGE assembly 24 by a rolling gimbal harness 50. The harness is fabricated of a plurality of shielded twisted pair wires. Conventional twisted shielded pairs are two insulated signal wires twisted about each other and then covered with braided metal shielding. The metal shielding is then insulated with a dielectric flexible electrical insulator material. In this embodiment, the wire insulator material is laser stripped away from the twisted wire pair. A plurality of twisted wire pairs with the insulation stripped away are then imbedded in a highly flexible silicon material. This improves flexibility and allows for a larger number of signal wires to fit in a particular width of harness tape.

Figure 2:
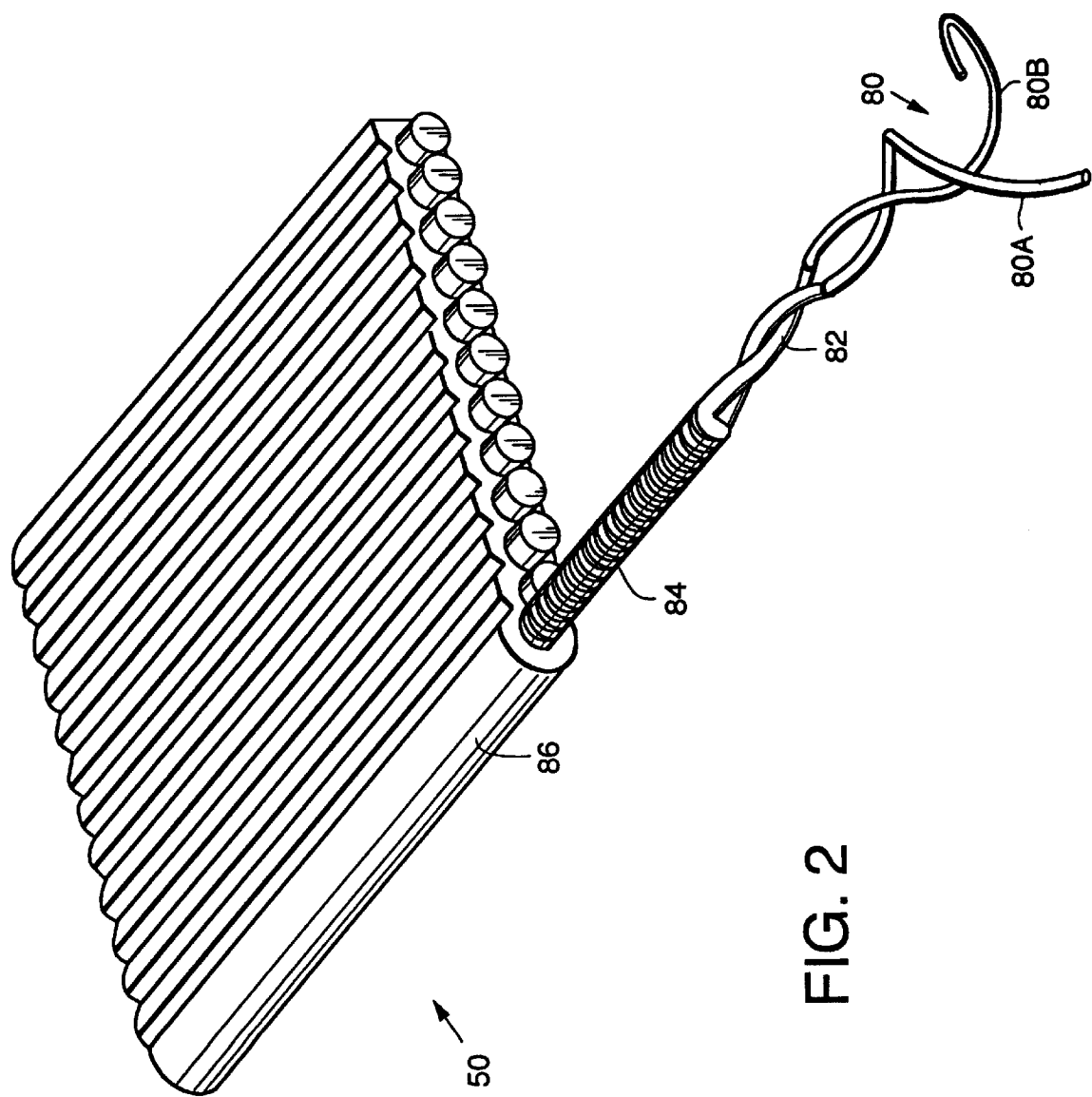
FIG. 2 is an isometric view of an illustrative portion of the rolling gimbal harness.

FIG. 2 is an isometric view of an illustrative portion of the rolling gimbal harness 50. One exemplary twisted wire pair 80 is shown, with each wire 80A, 80B covered with wire insulation 82. Each wire pair is covered with braided metal shielding 84. The plurality of twisted wire pairs are embedded in a silicon tape jacket 86.

FIG. 3A is a partially exploded isometric view of the rolling gimbal harness 50 and the gimbal track 30. The rolling gimbal harness 50 further includes Nano connectors 62 and 64, which terminate the twisted wire pairs. These connectors are very small connectors with lead pins centered 0.025 inch apart. Conventional harnesses with twisted shielded pairs are terminated in Micro connectors with pins that are 0.050 inch apart. A clamp 36 holds the harness 50 in position on the track 30. Another clamp 38 is carried by the platform 20, and holds the harness 50 up and secures the connector 62 in its connected position relative to the OGE assembly 24. A clamp 40 joins together sections of the harness track 30.

Another feature of the rolling gimbal harness is that it is pre-formed diametrically in order to follow a circumferential path. This is illustrated in FIG. 4, a top view of the harness laid flat. As shown therein, the harness includes an arcuate portion 50A, a first linear portion 50B, and a second linear portion 50C. In this exemplary embodiment, the arcuate portion follows a circular circumferential path formed on a radius from a center point 52. The ends of the arcuate portion join the linear portions at relatively sharp radius turns 54A and 54B. The shape of the harness is pre-formed to follow the circular periphery of the gimbal track 30. The pre-forming is done using molds and guides during the harness fabrication.

FIG. 5 is a front view of the harness 50 of FIG. 4; FIGS. 6 and 7 are respective partial bottom views showing the connectors 62 and 64. In this exemplary embodiment, the connectors are right angle connectors, with the pins of the connectors extending at right angles to the ends of the twisted wire pairs forming the harness.

Figure 8:
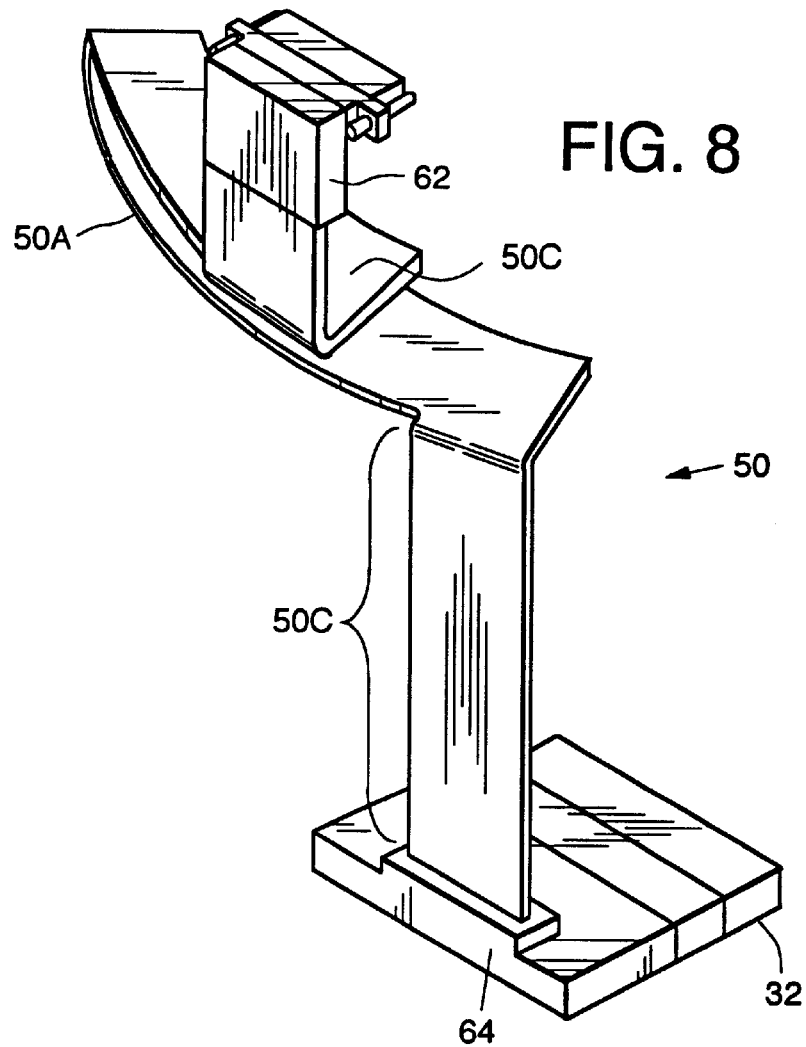
FIG. 8 is an isometric view of the rolling gimbal harness in the state shown in FIG. 1.

FIG. 8 shows the harness 50 in its position when assembled in position relative to the gimbal. The arcuate portion 50A is folded over onto itself, with portion 50B extending upwardly for making the connection to the OGE 24. The portion 50C extends downwardly to make the connection to the NGE 32.

Figure 9:
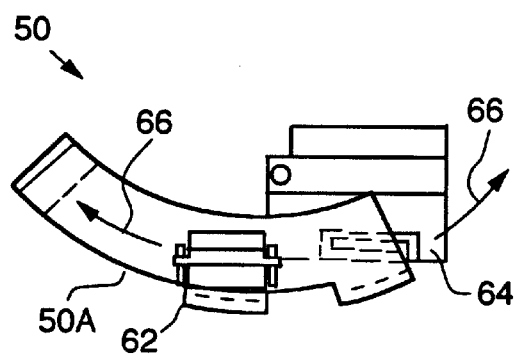
FIG. 9 is a top view of the harness of FIG. 8.

FIG. 9 is a top view of the harness 50 of FIG. 8, illustrating the relative positioning of the connectors 62 and 64 and the arcuate portion 50A of the harness. It will be readily apparent that, as the gimbal platform rolls about the Y axis (FIG. 1), the position of the connector 62 will move along the directions of arrows 66, and the harness is constrained to travel in a constrained track to follow the moving connector 62. Moreover, the harness negotiates the dynamic range of the gimbal with very little spring torque and friction. This is important to operation of the control algorithm for the missile.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A highly flexible wiring harness, comprising:

a plurality of shielded twisted wire pairs, each comprising two insulated signal wires twisted together and covered with a flexible, electrically conductive shielding;

an outer insulator formed of a highly flexible electrically nonconducting material, said twisted wire pairs embedded in said outer insulator in an aligned configuration to form a ribbon, said outer insulator having a flat, thin external ribbon configuration to define the other perimeter of said wiring harness;

and wherein said outer insulator is in direct contact with said flexible shielding, wherein the connectors comprise a plurality of pins arranged in a closely packed configurations, said pins on 0.025 inch center spacing.

2. The harness of claim 1 wherein said flexible electrically conductive shielding is a braided metal shielding.

3. The harness of claim 1 further comprising first and second connectors for terminating first and second ends of the twisted wire pairs.

4. The harness of claim 1 further comprising an arcuate region which is pre-formed to follow a curved path.

5. The harness of claim 4 wherein said curved path is a circumferential path.

6. The harness of claim 4 further comprising first and second linear regions, said first linear region extending from a first end of the arcuate region, said second linear region extending from a second end of the arcuate region.

7. An airborne missile comprising:

a gimbal platform carrying an on-gimbal electronics (OGE) assembly;

a gimbal track mounted in fixed relation to a missile body, and wherein the platform has a dynamic motion range relative to said track about an axis generally transverse to said platform;

a near-gimbal electronics (NGE) assembly mounted in fixed relation to said gimbal track; and a rolling gimbal harness for electrically interconnecting said OGE assembly and said NGE assembly, said harness comprising a plurality of shielded twisted wire pairs, each comprising two insulated signal wires twisted together and covered with a flexible, electrically conductive shielding;

an outer insulator formed of a highly flexible non-conducting material, said twisted wire pairs embedded in said outer insulator in an aligned configuration to form a ribbon, said outer insulator having a flat, thin external ribbon configuration to define the outer perimeter of said wiring harness;

and wherein said outer insulator is in direct contact with said flexible shielding, said harness negotiating said dynamic range of said gimbal with very little spring torque and friction.

8. The missile of claim 7 wherein said flexible electrically conductive shielding is a braided metal shielding.

9. The missile of claim 7 further comprising first and second connectors for terminating first and second ends of the twisted wire pairs.

10. The missile of claim 9 wherein the connectors comprise a plurality of pins arranged in a closely packed configurations, said pins on 0.025 inch center spacing.

11. The missile of claim 7 wherein the harness further comprises an arcuate region which is pre-formed to follow a curved path, said path following a circumferential region defined by said platform.

12. The missile of claim 11 wherein the harness further comprises first and second linear regions, said first linear region extending from a first end of the arcuate region, said second linear region extending from a second end of the arcuate region.

13. A method of making a flexible wiring harness, comprising the steps of:

providing a plurality of twisted wire pairs, each comprising two insulated signal wires twisted together and covered with a flexible, electrically conductive shielding;

embedding the twisted wire pairs in an outer insulator formed of a highly flexible non-conducting material, said twisted wire pairs embedded in an aligned configuration to form a ribbon, said outer insulator having flat, thin external ribbon configuration to define the outer perimeter of said wiring harness;

and wherein said outer insulator is in direct contact with said flexible shielding, wherein the step of providing said twisted wire pair comprises:

providing a plurality of twisted wire pairs, each comprising two insulated signal wires twisted together and covered with a flexible, electrically conductive shielding, said shielding covered by a layer of electrically insulating material; and removing said layer of electrically insulating material to expose said conductive shielding.

\* \* \* \* \*